United States Patent
Huang

(10) Patent No.: US 12,376,247 B2
(45) Date of Patent: Jul. 29, 2025

(54) TUBE-EMBEDDED GPS BOX INSTALLATION LOCKING STRUCTURE

(71) Applicant: Tenways Technovation Europe B.V., Amsterdam (NL)

(72) Inventor: He Huang, Shenzhen (CN)

(73) Assignee: Tenways Technovation Europe B.V., Amsterdam (NL)

(*) Notice: Subject to any disclaimer, the term of this patent is extended or adjusted under 35 U.S.C. 154(b) by 92 days.

(21) Appl. No.: 18/543,218

(22) Filed: Dec. 18, 2023

(65) Prior Publication Data

US 2024/0306329 A1    Sep. 12, 2024

(51) Int. Cl.
*B62K 19/40* (2006.01)
*H05K 5/02* (2006.01)

(52) U.S. Cl.
CPC ................... *H05K 5/0221* (2013.01)

(58) Field of Classification Search
CPC ....... H05K 5/0221; G01S 19/14; G01S 19/35; B62K 3/04; B62K 3/08; B62K 19/40; B62H 5/20; Y02E 10/50; B62J 45/00; B62J 45/20; B62J 45/42; B62J 43/28; B62J 50/225
USPC .............................. 340/995.1–996
See application file for complete search history.

(56) References Cited

U.S. PATENT DOCUMENTS

| | | | |
|---|---|---|---|
| 8,949,022 B1* | 2/2015 | Fahrner | G01C 21/20 340/995.19 |
| 9,157,742 B1* | 10/2015 | Fahrner | B62H 5/00 |
| 10,472,015 B1* | 11/2019 | Sonderegger | B62J 43/30 |
| 2017/0061748 A1* | 3/2017 | Graham | G08B 5/002 |
| 2018/0290702 A1* | 10/2018 | Carlier | B62J 45/20 |
| 2018/0359610 A1* | 12/2018 | Ølmheim | B62H 5/20 |
| 2020/0094898 A1* | 3/2020 | Johnson | B62K 19/40 |

FOREIGN PATENT DOCUMENTS

| | | | | |
|---|---|---|---|---|
| CN | 205256559 U | * | 5/2016 | |
| GB | 2492742 A | * | 1/2013 | ............. B62J 99/00 |

* cited by examiner

*Primary Examiner* — Cassandra Davis
(74) *Attorney, Agent, or Firm* — Westbridge IP LLC

(57) ABSTRACT

A tube-embedded GPS box installation locking structure includes a crossbar. The interior of the crossbar is provided with a GPS locator body; butt holes are formed in positions, close to edges on both sides, of a bottom of the GPS locator body; and the interior of each of the two butt holes is provided with a nylon sleeve. In the application, an interior of the crossbar is arranged to be hollow, and the GPS locator body is installed to the interior of the crossbar, the butt holes are formed in the positions, close to the edges on both sides, of the bottom of the GPS locator body during installation, and the interior of each of the two butt holes is provided with the nylon sleeve, so that the GPS locator body is conveniently fixed and locked at the bottom of the crossbar by bolts.

5 Claims, 4 Drawing Sheets

TUBE-EMBEDDED GPS BOX INSTALLATION LOCKING STRUCTURE

CROSS-REFERENCE TO RELATED APPLICATIONS

This application claims priority to Chinese Patent Application No. 202320449754.X, filed on Mar. 10, 2023, which is incorporated herein by reference in its entirety.

TECHNICAL FIELD

The application relates to the technical field of Global Positioning System (GPS) box installation, and in particular to a tube-embedded GPS box installation locking structure.

BACKGROUND

A GPS locator refers to a terminal with a built-in GPS module and a mobile communication module, which is configured to transmit locating data obtained by the GPS module to a server on Internet through the mobile communication module, so that a position of the terminal may be queried on a computer or a mobile phone. At present, the GPS locator is usually required on a bicycle for a series of operations such as acquiring a driving route of a user and locating.

Chinese Patent Publication No. CN211741578U discloses a GPS locator, and relates to the technical field of GPS locators. The GPS locator includes a lower cover plate, where the top of the lower cover plate is provided with an upper cover plate, a top end of the interior of the lower cover plate is provided with a clamping groove, an outer side of the bottom of the upper cover plate is provided with a protruding block, a bottom end of the interior of the clamping groove is provided with a rubber pad, an inner side of the lower cover plate is provided with a plurality of groups of fixed blocks, the ends, away from the lower cover plate, of the interiors of the fixed blocks are provided with rotating shafts, and outer sides of the rotating shafts are provided with lock catches. According to the application, a plurality of groups of limiting blocks on an inner side of the upper cover plate are inserted into the corresponding fixed blocks, and meanwhile, the limiting blocks are in contact with the lock catches, so that the lock catches and the rotating shafts rotate clockwise about the center of a circle. When the protruding block is completely pressed into the interior of the clamping groove, clamping blocks of the lock catches and clamping blocks at the tops of the limiting blocks are clamped to each other, so that the upper cover plate and the lower cover plate are fixed, the upper cover plate and the lower cover plate are locked, artificial damage is avoided, and the practicability of the GPS locator is improved.

According to the apparatus, the plurality of groups of limiting blocks on the inner side of the upper cover plate are inserted into the corresponding fixed blocks, and meanwhile, the limiting blocks are in contact with the lock catches, so that the lock catches and the rotating shafts rotate clockwise about the center of the circle. When the protruding block is completely pressed into the interior of the clamping groove, the clamping blocks of the lock catches and the clamping blocks at the tops of the limiting blocks are clamped to each other, so that the upper cover plate and the lower cover plate are fixed, but when being installed and used in the interior of the bicycle, the GPS locator usually needs to be installed to the exterior of the bicycle, which easily falls off when subjected to external impact, and is easily damaged in rainy days.

In view of this, the application is proposed.

SUMMARY

The technical problem to be solved by the application is to provide a tube-embedded GPS box installation locking structure, so as to overcome the problems in the related art that when being installed and used in the interior of a bicycle, the existing GPS locator usually needs to be installed to the exterior of the bicycle, which easily falls off when subjected to external impact, and is easily damaged in rainy days.

In order to solve the above technical problems, the basic concept of the technical solution adopted by the application is as follows.

A tube-embedded GPS box installation locking structure includes a crossbar. Two threaded holes are formed in the bottom of the crossbar. Each of the two threaded holes is provided with an adjusting bolt. The interior of the crossbar is hollow, a limiting opening is formed in the top of the crossbar, and the interior of the crossbar is provided with a GPS locator body. Butt holes are formed in positions, close to edges on both sides, of the bottom of the GPS locator body. The interior of each of the two butt holes is provided with a nylon sleeve. Three indicator lights are fixed to a position, close to the edge on one side, of the top of a cover plate. The interior of the crossbar is arranged to be hollow, and the GPS locator body is installed to the interior of the crossbar, so that the GPS locator body is protected.

Optionally, the cover plate is fixed to the top of the GPS locator body. The cover plate is clamped to the interior of the limiting opening, and four sides of the cover plate are in sealed connection with an inner wall of the limiting opening. A rubber sleeve is fixed to one side of the GPS locator body. The interior of the rubber sleeve is provided with a butt joint. The cover plate is clamped to the interior of the limiting opening, and the four sides of the cover plate are in sealed connection with the inner wall of the limiting opening, so as to prevent water from penetrating into the interior of the crossbar from the butt joint.

Optionally, a limiting bayonet is formed in one side of the GPS locator body, and two through holes are formed in the bottom of the GPS locator body. Both sides of the GPS locator body are correspondingly attached to attached to inner walls on both sides of the crossbar. The both sides of the GPS locator body are correspondingly attached to the inner walls on both sides of the crossbar, so as to prevent the GPS locator body from shaking.

After adopting the technical solution, the application has the following beneficial effects compared with the related art. Of course, any product implementing the application does not necessarily need to achieve all the advantages described below at the same time.

Firstly, in the application, when the apparatus is used, the interior of the crossbar is arranged to be hollow, and the GPS locator body is installed to the interior of the crossbar, so that the GPS locator body is protected; and in addition, the butt holes are formed in the positions, close to the edges on both sides, of the bottom of the GPS locator body during installation, and the interior of each of the two butt holes is provided with the nylon sleeve, so that the GPS locator body is conveniently fixed and locked at the bottom of the crossbar by the adjusting bolts. During locking, the adjusting bolts penetrate through the bottom of the crossbar, and the threaded holes and the butt holes are connected to each other, so as to complete the fixing.

Lastly, in the application, the cover plate is clamped to the interior of the limiting opening, and the four sides of the cover plate are in sealed connection with the inner wall of the limiting opening, so as to prevent water from penetrating into the interior of the crossbar from the butt joint; then, the indicator lights are arranged at the top of the cover plate to facilitate people to observe a working state of the GPS locator body; and when the butt joint is installed on one side of the GPS locator body, the rubber sleeve is arranged at a joint between the butt joint and the GPS locator body to strengthen the friction, so as to make the joint firmer.

BRIEF DESCRIPTION OF THE DRAWINGS

The drawings described below are only some embodiments. Other drawings may further be obtained by those of ordinary skill in the art according to these drawings without creative efforts.

DETAILED DESCRIPTION OF THE EMBODIMENTS

The application is further described now with reference to the drawings.

Embodiment 1

Figure 1:
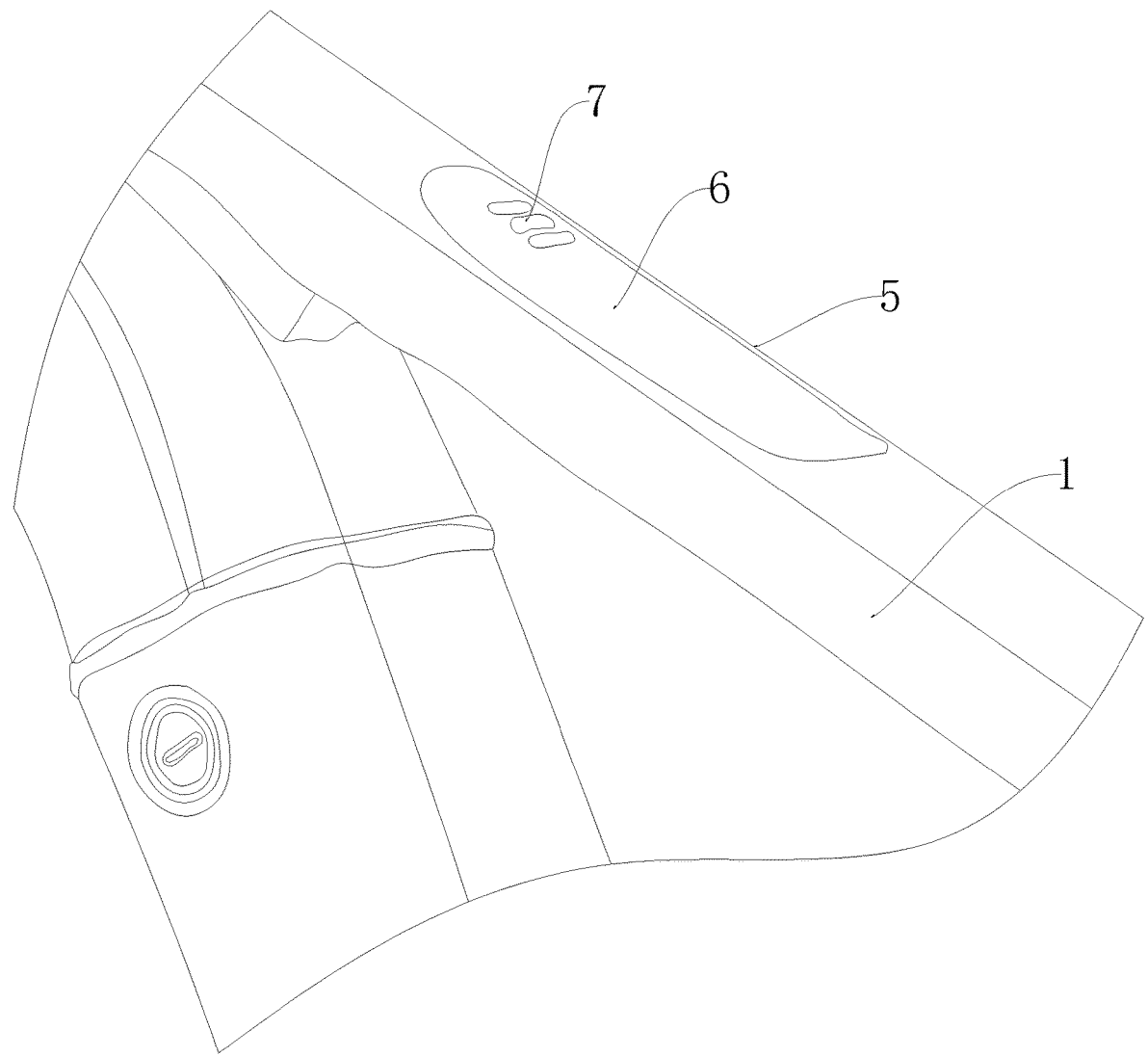
FIG. 1 is a schematic diagram of a stereoscopic structure of a tube-embedded GPS box installation locking structure provided by the application.
Figure 2:
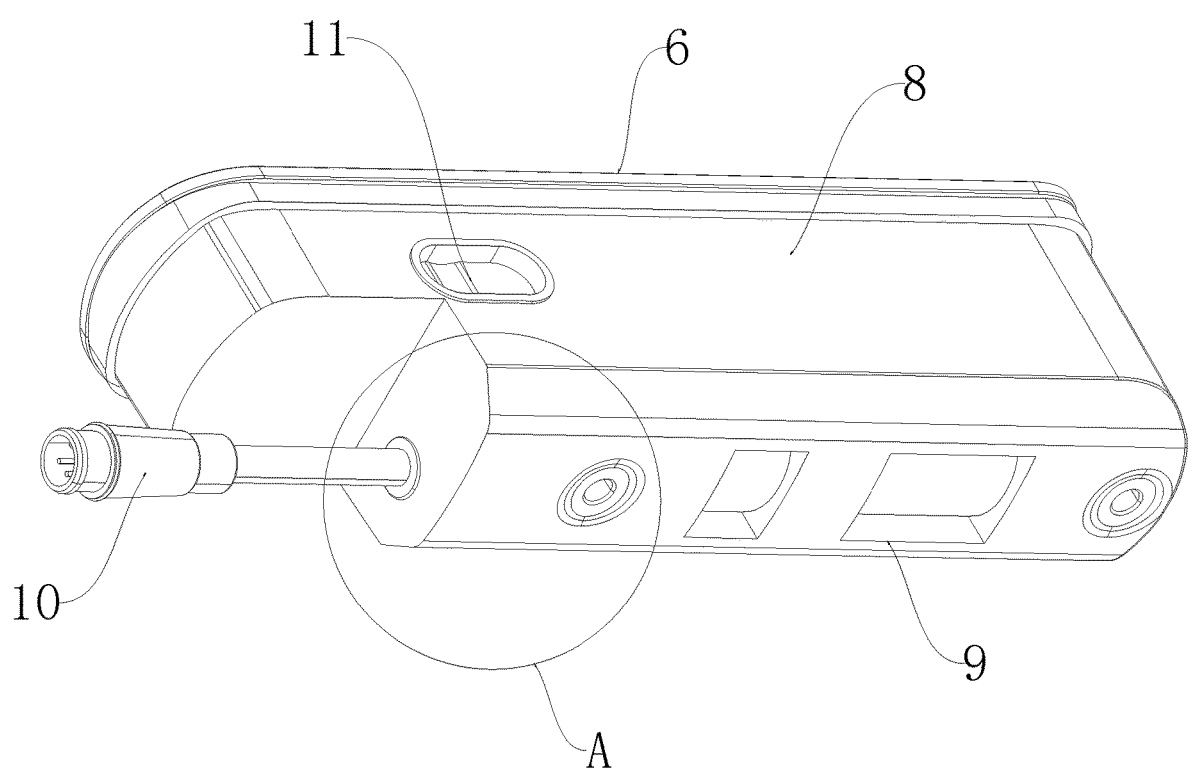
FIG. 2 is a schematic diagram of a stereoscopic structure of a GPS locator body in a tube-embedded GPS box installation locking structure provided by the application.
Figure 3:
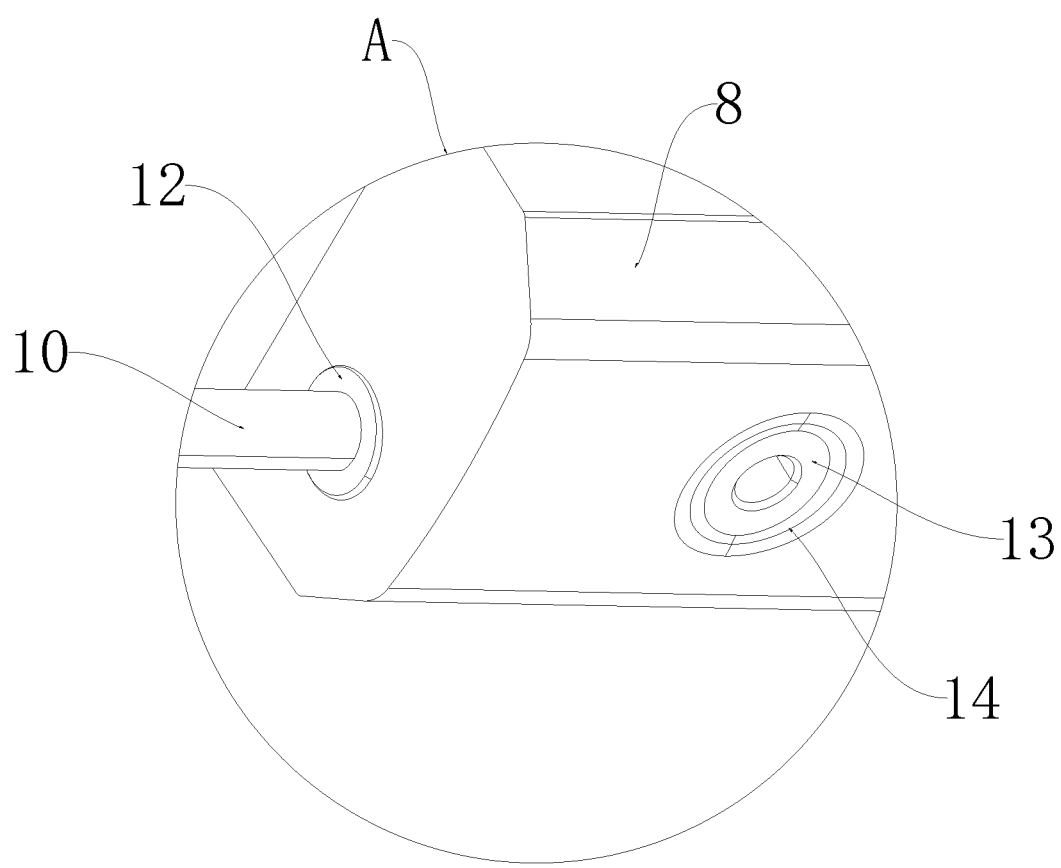
FIG. 3 is an enlarged view of the application at a place A in FIG. 2.
Figure 4:
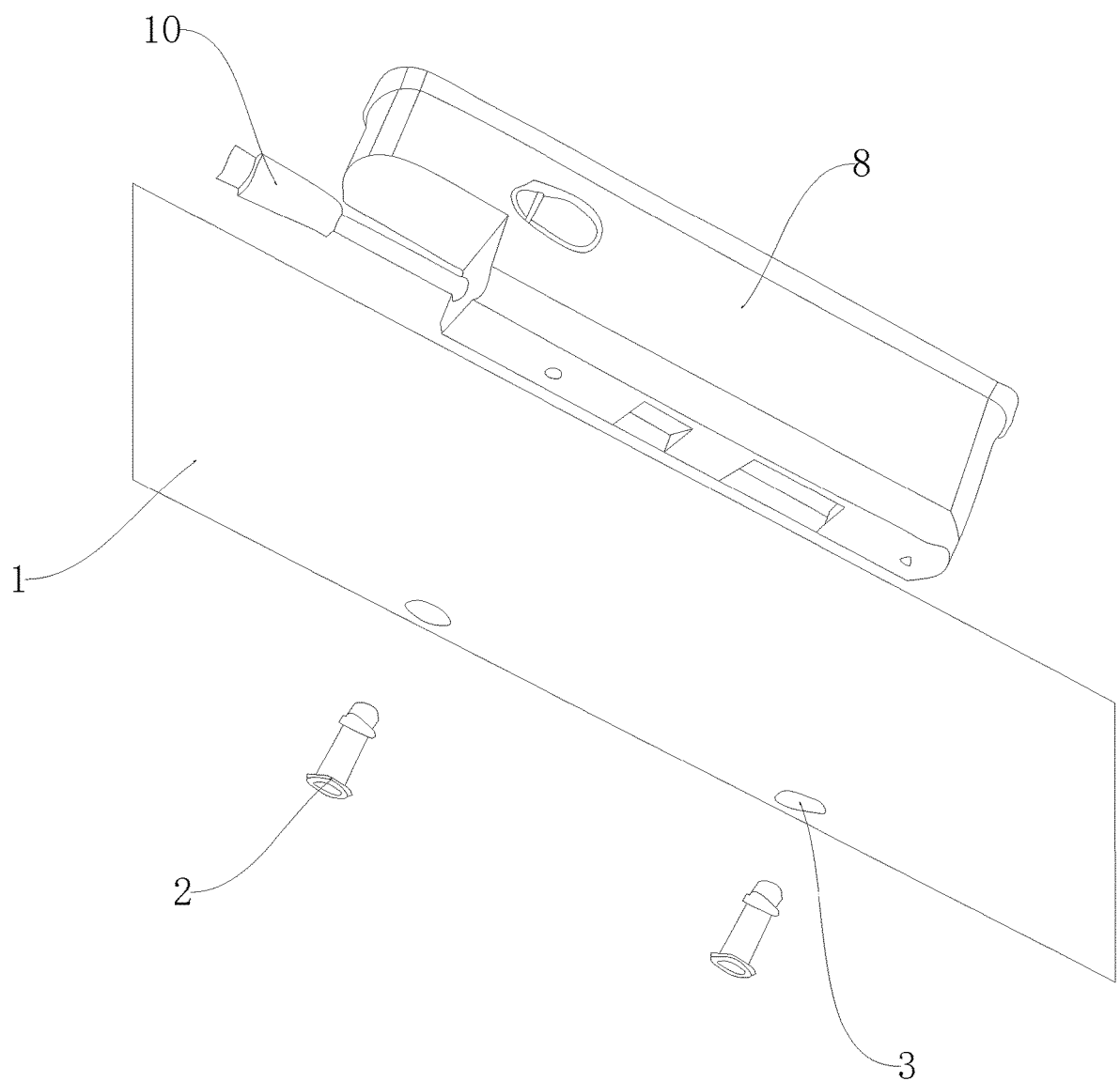
FIG. 4 is a schematic diagram of installation and disassembly of a GPS locator body in a tube-embedded GPS box installation locking structure provided by the application.

As shown in FIGS. 1 to 4, the application provides a tube-embedded GPS box installation locking structure, which includes a crossbar 1. Two threaded holes 3 are formed in the bottom of the crossbar 1. Each of the two threaded holes 3 is provided with an adjusting bolt 2. The interior of the crossbar 1 is hollow, a limiting opening 5 is formed in the top of the crossbar 1, and the interior of the crossbar 1 is provided with a GPS locator body 8. Butt holes 14 are formed in positions, close to edges on both sides, of the bottom of the GPS locator body 8. The interior of each of the two butt holes 14 is provided with a nylon sleeve 13. Three indicator lights 7 are fixed to a position, close to the edge on one side, of the top of a cover plate 6.

The effects achieved by the whole Embodiment 1 are that: when the apparatus is used, the interior of the crossbar 1 is arranged to be hollow, and the GPS locator body 8 is installed to the interior of the crossbar 1, so that the GPS locator body 8 is protected.

In addition, the butt holes 14 are formed in the positions, close to the edges on both sides, of the bottom of the GPS locator body 8 during installation, and the interior of each of the two butt holes 14 is provided with the nylon sleeve 13, so that the GPS locator body 8 is conveniently fixed and locked at the bottom of the crossbar 1 by the adjusting bolts. During locking, the adjusting bolts 2 penetrate through the bottom of the crossbar 1, and the threaded holes 3 and the butt holes 14 are connected to each other, so as to complete the fixing.

The application solves the problems that when being installed and used in the interior of a bicycle, the existing GPS locator usually needs to be installed to the exterior of the bicycle, which easily falls off when subjected to external impact, and is easily damaged in rainy days.

Embodiment 2

As shown in FIGS. 1 to 4, the cover plate 6 is fixed to the top of the GPS locator body 8. The cover plate 6 is clamped to the interior of the limiting opening 5, and four sides of the cover plate 6 are in sealed connection with an inner wall of the limiting opening 5. A rubber sleeve 12 is fixed to one side of the GPS locator body 8. The interior of the rubber sleeve 12 is provided with a butt joint 10. A limiting bayonet 11 is formed in one side of the GPS locator body 8, and two through holes 9 are formed in the bottom of the GPS locator body 8. A reinforcement tube is fixed to a position, close to a bottom edge, of a front side of a front rotating sleeve, one side of the reinforcement tube is provided with a locking bolt, and both sides of the GPS locator body 8 are correspondingly attached to inner walls on both sides of the crossbar 1.

The effects achieved by the whole Embodiment 2 are that: the cover plate 6 is clamped to the interior of the limiting opening 5, and the four sides of the cover plate 6 are in sealed connection with the inner wall of the limiting opening 5, so as to prevent water from penetrating into the interior of the crossbar 1 from the butt joint.

The indicator lights 7 are arranged at the top of cover plate 6 to facilitate people to observe a working state of the GPS locator body 8. When the butt joint 10 is installed on the side of the GPS locator body 8, the rubber sleeve 12 is arranged at a joint between the butt joint 10 and the GPS locator body 8 to strengthen the friction, so as to make the joint firmer.

The application is not limited to the above implementations, and any person should be aware of structural changes made under the inspiration of the application, and any technical solutions identical or similar to the application shall fall within the scope of protection of the application. The technologies, shapes and structural parts of the application not described in detail are all known technologies.

What is claimed is:

1. A tube-embedded Global Positioning System (GPS) box installation locking structure, comprising a crossbar, wherein two threaded holes are formed in a bottom of the crossbar; each of the two threaded holes is provided with an adjusting bolt; an interior of the crossbar is hollow, a limiting opening is formed in a top of the crossbar, and the interior of the crossbar is provided with a GPS locator body; butt holes are formed in positions, close to edges on both sides, of a bottom of the GPS locator body; an interior of each of the two butt holes is provided with a nylon sleeve; and three indicator lights are fixed to a position, close to the edge on one side, of a top of a cover plate.

2. The tube-embedded GPS box installation locking structure according to claim 1, wherein the cover plate is fixed to a top of the GPS locator body; and the cover plate is clamped to an interior of the limiting opening, and four sides of the cover plate are in sealed connection with an inner wall of the limiting opening.

3. The tube-embedded GPS box installation locking structure according to claim 1, wherein a rubber sleeve is fixed to one side of the GPS locator body; and an interior of the rubber sleeve is provided with a butt joint.

4. The tube-embedded GPS box installation locking structure according to claim 1, wherein a limiting bayonet is formed in one side of the GPS locator body, and two through holes are formed in the bottom of the GPS locator body.

5. The tube-embedded GPS box installation locking structure according to claim 1, wherein both sides of the GPS locator body are correspondingly attached to inner walls on both sides of the crossbar.

* * * * *